(12) United States Patent
Kuriyama et al.

(10) Patent No.: US 7,531,070 B2
(45) Date of Patent: May 12, 2009

(54) SPUTTERING POWER-SUPPLY UNIT

(75) Inventors: Noboru Kuriyama, Yokohama (JP); Kazuhiko Imagawa, Yokohama (JP)

(73) Assignee: Shibaura Mechatronics Corporation, Yokohama-shi (JP)

( * ) Notice: Subject to any disclaimer, the term of this patent is extended or adjusted under 35 U.S.C. 154(b) by 912 days.

(21) Appl. No.: 10/800,935

(22) Filed: Mar. 15, 2004

(65) Prior Publication Data
US 2004/0182696 A1 Sep. 23, 2004

Related U.S. Application Data

(63) Continuation of application No. PCT/JP02/09827, filed on Sep. 25, 2002.

(30) Foreign Application Priority Data

| Sep. 28, 2001 | (JP) | ............................. 2001-303689 |
| Sep. 28, 2001 | (JP) | ............................. 2001-303691 |

(51) Int. Cl.
C23C 14/34 (2006.01)
(52) U.S. Cl. .............................. 204/298.08; 204/298.06
(58) Field of Classification Search ............ 204/298.08, 204/298.06
See application file for complete search history.

(56) References Cited

U.S. PATENT DOCUMENTS 5,303,139 A * 4/1994 Mark ........................... 363/63
6,113,760 A 9/2000 Kuriyama et al.

FOREIGN PATENT DOCUMENTS

| CN | 1248298 | 3/2000 |
|----|---------|--------|
| DE | 3924398 | 1/1991 |
| EP | 0 989 202 | 3/2000 |
| EP | 1013792 | 6/2000 |
| JP | 2194831 | 8/1990 |
| JP | 5311418 | 11/1993 |
| JP | 7233472 | 5/1995 |
| JP | 8041636 | 2/1996 |
| JP | 9071863 | 3/1997 |
| JP | 9137271 | 5/1997 |
| JP | 9279337 | 10/1997 |
| JP | 2835322 | 10/1998 |
| JP | 2835323 | 10/1998 |
| JP | 10298754 | 11/1998 |
| JP | 10298755 | 11/1998 |
| JP | 2000-278950 | * 10/2000 |
| WO | 9925060 | 5/1999 |

OTHER PUBLICATIONS

Supplementary European Search Report dated Sep. 5, 2008 from counterpart European Patent Application No. 02772900.3-2207.

* cited by examiner

*Primary Examiner*—Rodney G McDonald
(74) *Attorney, Agent, or Firm*—Volpe and Koenig, P.C.

(57) ABSTRACT

A sputtering power-supply unit comprises a voltage generation section which generates a sputtering voltage between a negative electrode output terminal and a positive electrode output terminal, and a circuit section which reduces fluctuation in a sputtering current even if an arc discharge occurs between the negative electrode output terminal and the positive electrode output terminal. Thus, fluctuation in the sputtering current can be reduced even if the arc discharge occurs between the negative electrode output terminal and the positive electrode output terminal.

10 Claims, 15 Drawing Sheets

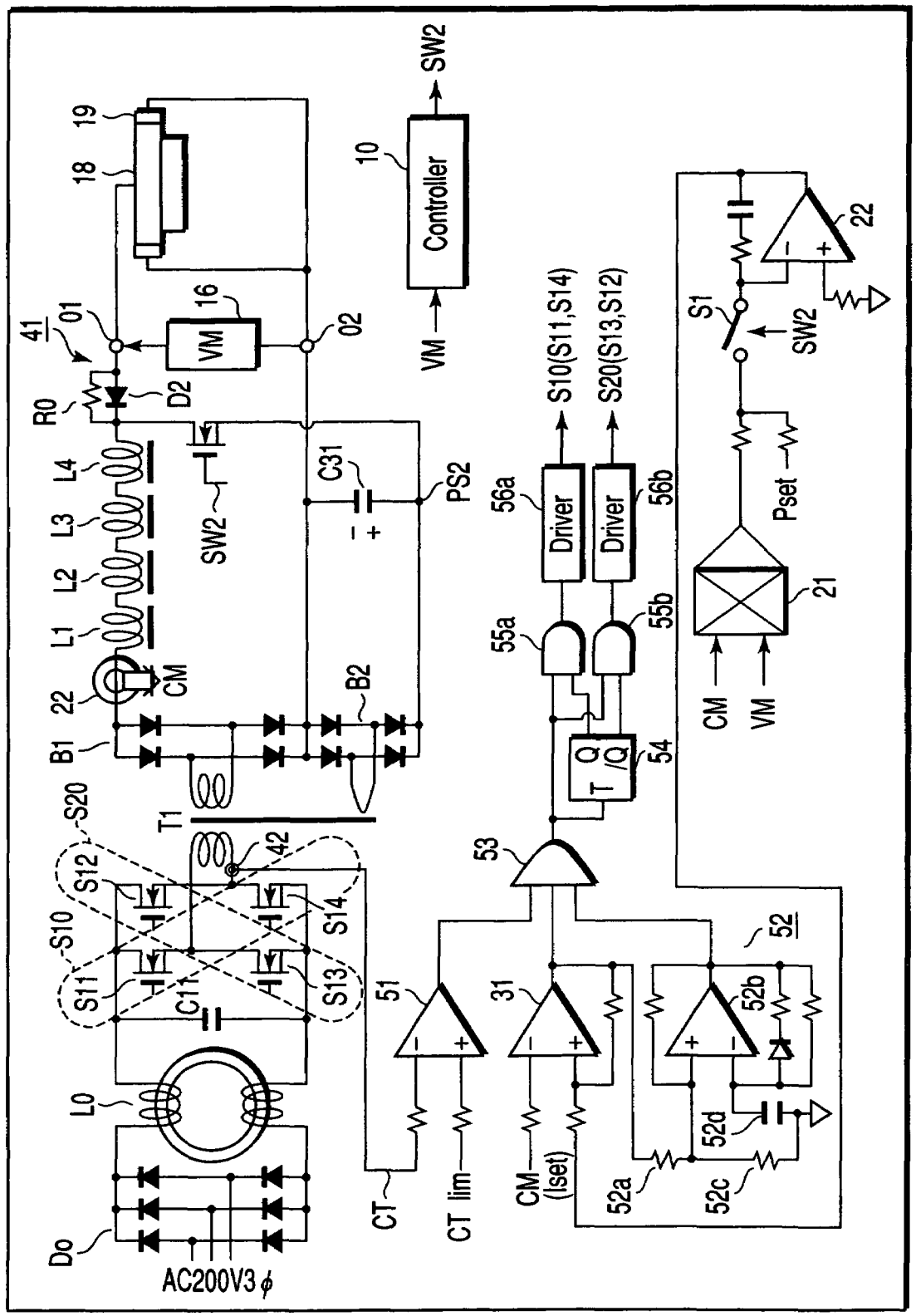
F I G. 6

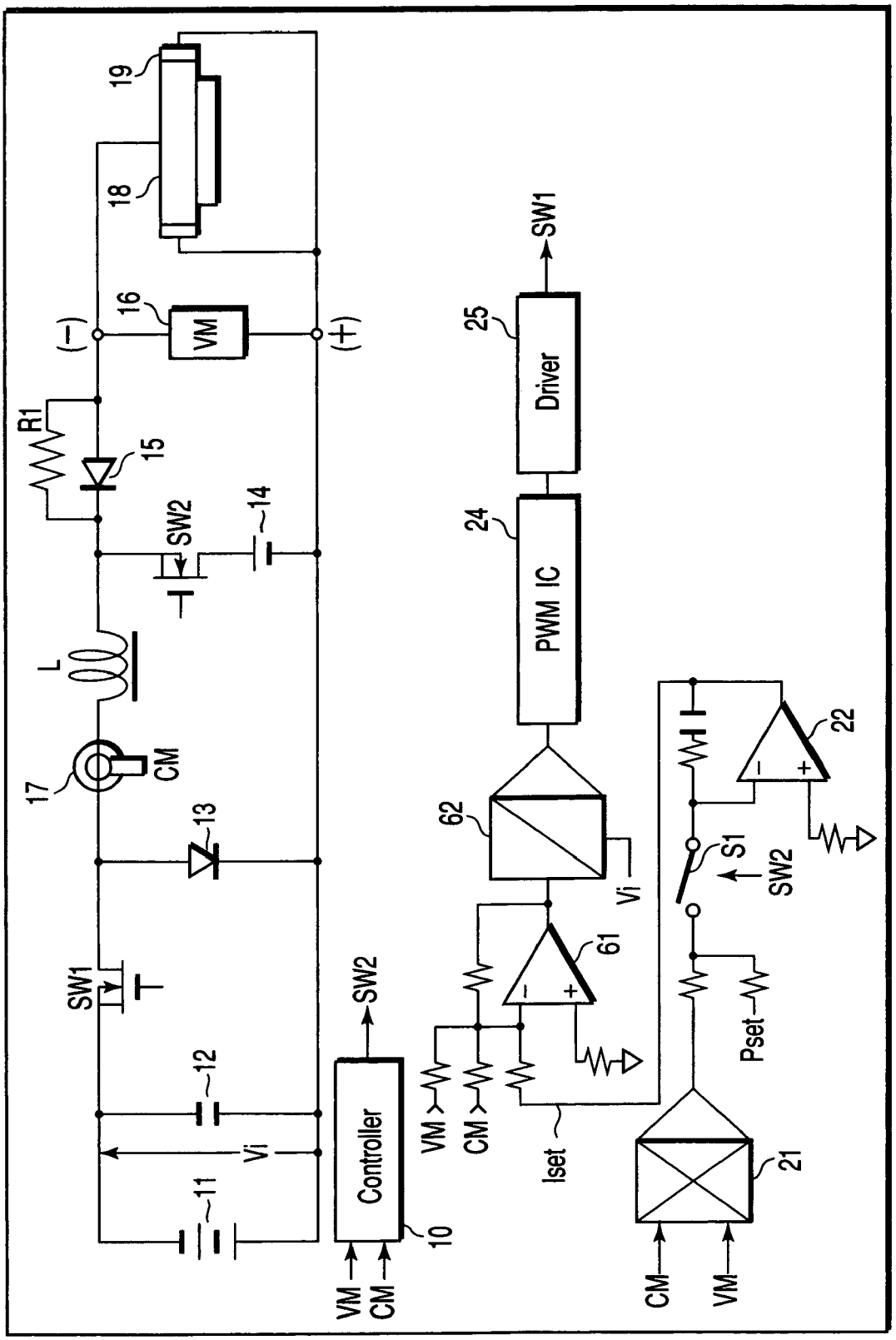
F I G. 8

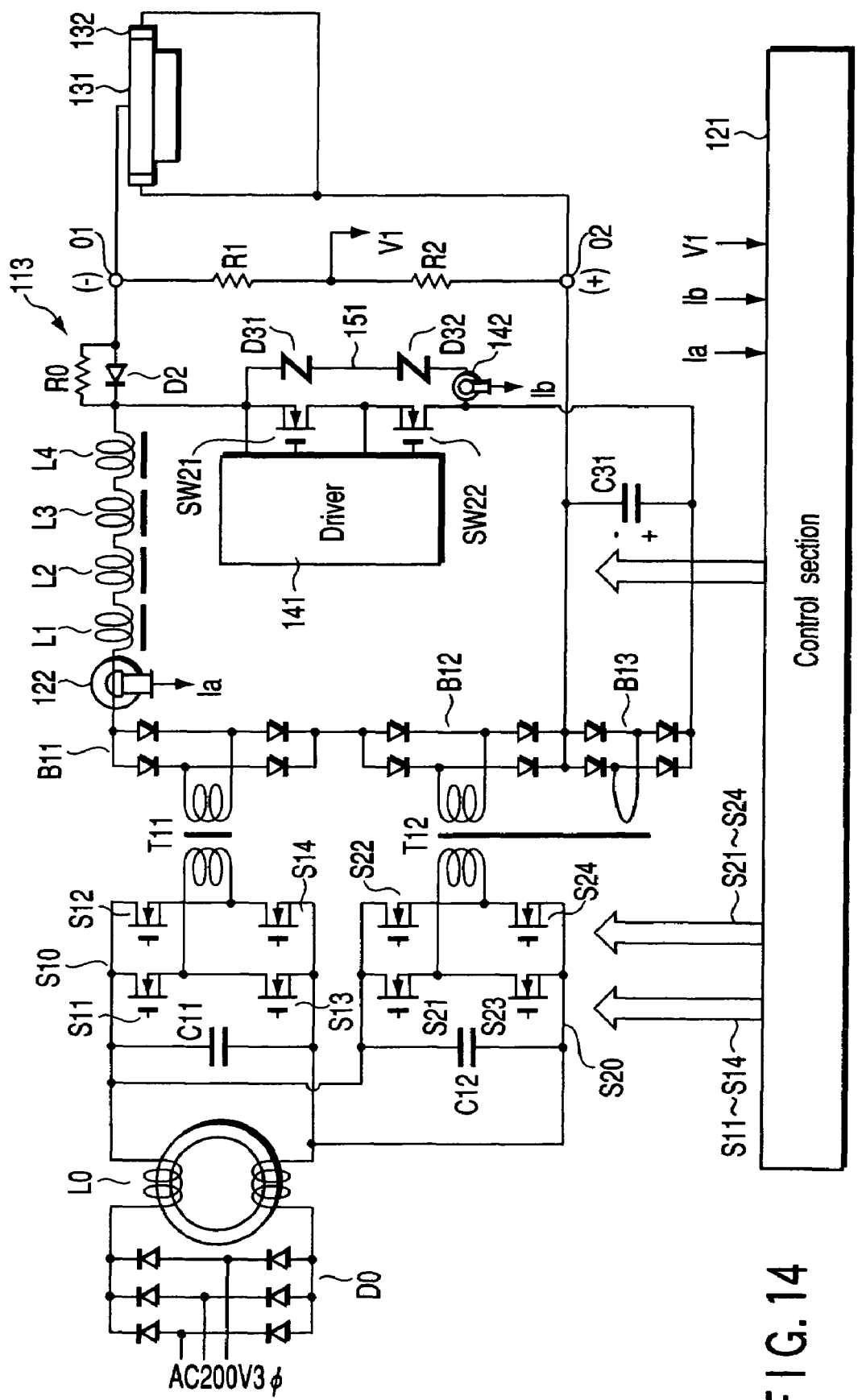
F I G. 14

US 7,531,070 B2

SPUTTERING POWER-SUPPLY UNIT

CROSS-REFERENCE TO RELATED APPLICATIONS

This is a Continuation Application of PCT Application No. PCT/JP02/09827, filed Sep. 25, 2002, which was not published under PCT Article 21(2) in English.

This application is based upon and claims the benefit of priority from the prior Japanese Patent Applications No. 2001-303689, filed Sep. 28, 2001; and No. 2001-303691, filed Sep. 28, 2001, the entire contents of both of which are incorporated herein by reference.

BACKGROUND OF THE INVENTION

1. Field of the Invention

The present invention relates to a sputtering power-supply unit for use in a sputtering device for the manufacture of a compact disc (CD) or a digital versatile disk (DVD).

2. Description of the Related Art

A sputtering power-supply unit for use in a sputtering device for the manufacture of a compact disc (CD) or a digital versatile disk (DVD) is known in Japanese Patent No. 2835322, Japanese Patent No. 2835323 and U.S. Pat. No. 5,576,939.

Formation of a film on the compact disc or the digital versatile disk is carried out by a magnetron sputtering technology. If suppression of arc discharge fails during this sputtering, a target material is scattered to adhere to the disk, with the result that production yield is reduced. Accordingly, if arc discharge occurs during the sputtering, a reverse voltage is generated to suppress the occurrence of the arc discharge. However, an arc suppression circuit has been destroyed sometimes because of disconnection of an output cable or the like.

Furthermore, in order to complete the film formation on the disk within a short time, it is necessary to increase the average power output from the sputtering power-supply unit.

However, when the average power is increased, arc discharge easily occurs during the sputtering, increasing the number of times when the suppression of the arc discharge fails.

It is desired that even if such arc discharge occurs, fluctuation in the sputtering current is reduced to stably continue sputtering discharge.

BRIEF SUMMARY OF THE INVENTION

An object of the present invention is to provide a sputtering power-supply unit which can reduce fluctuation in a sputtering current even if arc discharge occurs.

Another object of the present invention is to provide a sputtering power-supply unit less prone to breakdown.

A sputtering power-supply unit according to a first embodiment of the present invention comprises: a voltage generation section which generates a sputtering voltage between a negative electrode output terminal and a positive electrode output terminal; and a circuit section which reduces fluctuation in a sputtering current even if arc discharge occurs between the negative electrode output terminal and the positive electrode output terminal.

That is, according to the sputtering power-supply unit of the first embodiment of the present invention, by disposing the circuit section which reduces fluctuation in a sputtering current even if arc discharge occurs between the negative electrode output terminal and the positive electrode output terminal, it is possible to reduce fluctuation in a sputtering current even if arc discharge occurs.

A sputtering power-supply unit according to another embodiment of the present invention, which has a negative electrode output terminal and a positive electrode output terminal, comprises: a DC power source which generates an output of a predetermined voltage; a switching circuit which has a plurality of switching elements connected to bridges, and converts an output of the DC power source into a pulse output; a transformer which receives a primary pulsed voltage from the switching circuit, and outputs a secondary pulsed voltage; a rectification circuit which rectifies the secondary pulsed voltage output from the transformer; a choke coil connected to an output side of the rectification circuit; a reverse voltage generation source; a switching section disposed between the reverse voltage generation source and the choke coil; a constant voltage element connected in parallel with the switching section; and a control section which outputs a switching control signal to the switching element, and a switching control signal to control opening/closing of the switching section.

That is, according to the sputtering power-supply unit of the other embodiment of the present invention, it is possible to prevent destruction of the switching section operated when a reverse voltage is generated.

BRIEF DESCRIPTION OF THE SEVERAL VIEWS OF THE DRAWING

FIG. 6 is a constitutional view of a sputtering power-supply unit according to a fifth embodiment of the present invention.

FIG. 8 is a constitutional view of a sputtering power-supply unit according to a seventh embodiment of the present invention.

FIG. 14 is a constitutional view of a sputtering power-supply unit according to a thirteenth embodiment of the present invention.

DETAILED DESCRIPTION OF THE INVENTION

Figure 1:
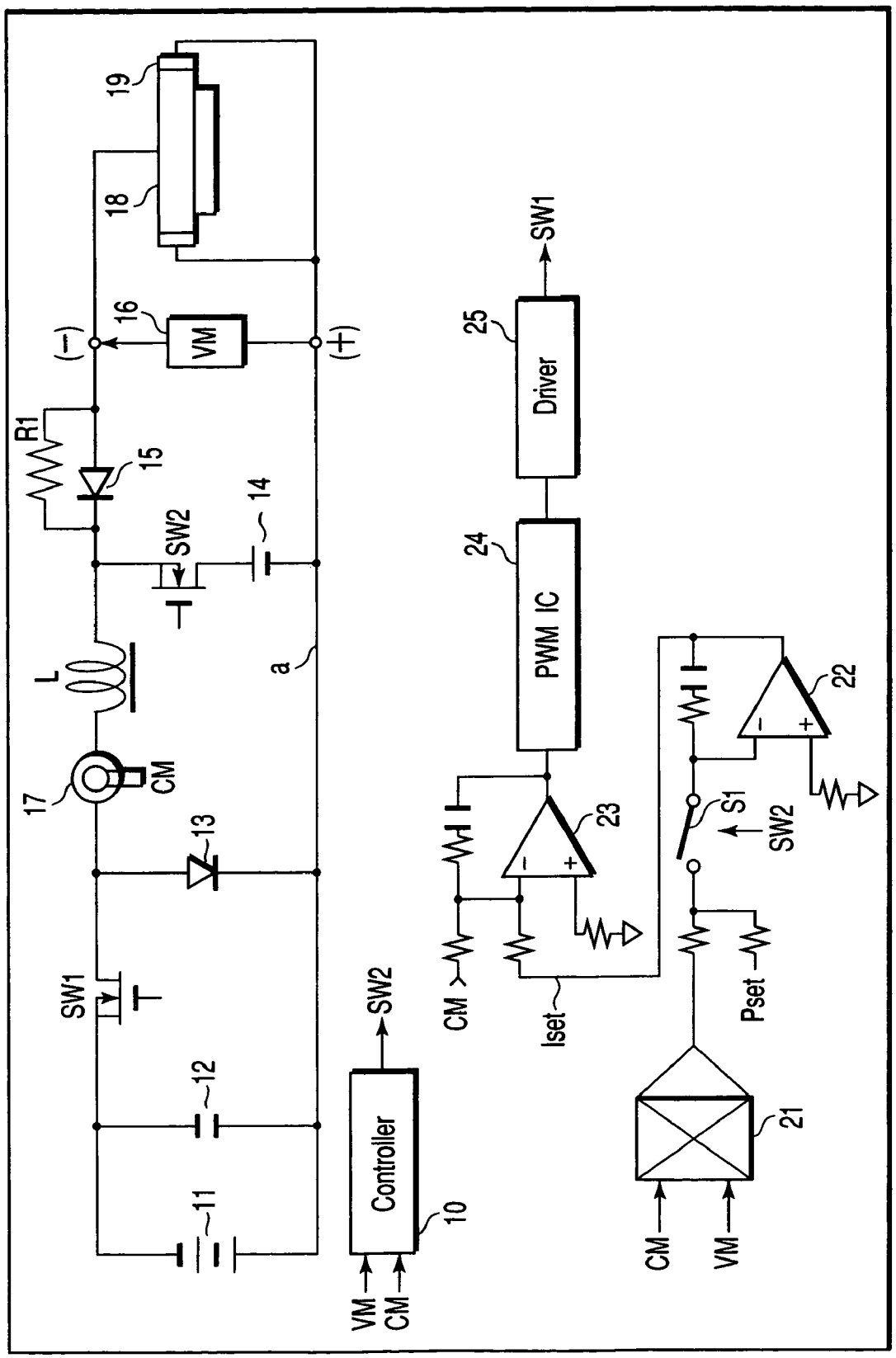
FIG. 1 is a constitutional view of a sputtering power-supply unit according to a first embodiment of the present invention.

Hereinafter, an embodiment of the present invention will be described with reference to the accompanying drawings. In FIG. 1, reference numeral 10 denotes a control section which controls a sputtering power-supply unit.

Reference numeral 11 denotes a sputtering DC power source of, e.g., 800 V. Between both electrodes of this DC power source 11, a capacitor 12 is connected in parallel.

The negative electrode of the DC power source 11 is connected to the source of a switching transistor SW1.

A flywheel diode 13 is connected between the drain of the switching transistor SW1 and the positive electrode of the DC power source 11. The drain of the switching transistor SW1 is connected through a choke coil L to the source of a switching transistor SW2. The positive electrode of a reverse voltage source 14 is connected to the drain of this switching transistor SW2. The negative electrode of the reverse voltage source 14 is connected to a ground line a.

The source of the transistor SW2 is connected to the cathode of a diode 15. A resistor R1 is connected in parallel with the diode 15. The diode 15 and the resistor R1 constitute a reverse direction arc prevention circuit.

The anode of the diode 15 is connected to the negative electrode (−) of the sputtering power-supply unit. The ground line a is connected to the positive electrode (+) thereof.

A load voltage VM between the negative electrode (−) and the positive electrode (+) of the sputtering power-supply unit is detected by a voltage detection section 16. Here, the sputtering voltage is normally 300 V or higher and the arc discharge voltage is 150 V or lower during sputtering discharge in a chamber 19. Thus, detection of the load voltage VM enables determination as to normal execution of sputtering and occurrence of arc discharge.

Further, a current detector 17 is disposed between the anode of the diode 13 and the choke coil L. A load current CM is detected by this current detector 17.

The negative electrode (−) is connected to a target 18, and the positive electrode (+) is connected to the chamber 19.

Incidentally, the load voltage detected by the voltage detection section 16 and the load current detected by the current detector 17 are input to a controller 10. The controller 19 detects the load voltage VM, determines the occurrence of arc discharge in the chamber 19 if the voltage is 150 V or lower, turns ON a gate signal SW2 to output it to the transistor SW2, and accordingly makes the transistor SW2 conduct.

The load voltage VM detected by the voltage detection section 16 and the load current CM detected by the current detector 17 are multiplied by an analog multiplier 21 to calculate instantaneous power P. Then, the difference between this instantaneous power P and set power Pset, i.e., error power, is calculated, and input through a switch S1 to a power feedback error amplifier 22. At this error amplifier 22, the error power is integrated. Here, the switch S1 is circuit-opened (opened) when a gate control signal SW2 output from the controller 10 is turned ON to be output.

Then, the output of the error amplifier 22 is input as a set current value Iset to an error amplifier 23. The error amplifier 23 amplifies the difference between the load current CM and the set current value Iset to output it to a PWMIC 24. This PWMIC 24 outputs a signal having a pulse width in accordance with the difference between the load current CM and the set current value Iset to a driver 25. A gate control signal SW1 is output from the driver 25 to the transistor SW1.

Next, operation will be described. If sputtering is carried out in the chamber 19 in a state of no arc generation, a sputtering voltage of 300 V or higher is detected as a load voltage by the voltage detection section 16.

Accordingly, the controller 10 turns OFF the gate control signal SW2. That is, a reverse voltage supply 14 is not applied to suppress arc generation.

In such a state, the switch Si is closed. Thus, the load voltage VM detected by the voltage detection section 16 and the load current CM detected by the current detector 17 are multiplied by the analog multiplier 21 to calculate instantaneous power P. Then, the difference between this instantaneous power P and set power Pset, i.e., error power, is calculated, and input through the switch S1 to a power feedback error amplifier 22. At this error amplifier 22, the error power is integrated.

Then, the output of the error amplifier 22 is input as a set current value Iset to an error amplifier 23. The error amplifier 23 amplifies the difference between the load current CM and the set current value Iset to output it to the PWMIC 24. This PWMIC 24 outputs a signal having a pulse width in accordance with the difference between the load current CM and the set current value Iset to the driver 25. The transistor SW1 is ON/OFF controlled by the driver 25.

That is, feedback control is carried out to realize the set power Pset, and the set current value Iset is set based on the difference between the instantaneous power of the sputtering power-supply unit and the set power Pset.

On the other hand, when an arc is generated in the chamber 9, the load voltage VM detected by the voltage detection section 16 is reduced to 150 V or lower. Then, the gate control signal SW2 output from the controller 10 is turned ON to output a positive voltage output from the reverse voltage source 14 to the chamber 19, whereby the arc generation is suppressed.

Since the gate control signal SW2 is turned ON, the switch S1 is turned OFF. Thus, the set current value Iset output from the error amplifier 22 is maintained at a value immediately before arc generation in the chamber 19.

Normally, when the sputtering power-supply unit is constant-power run by the set power Pset, if an arc is generated in the chamber 19, reducing the load voltage VM, control is carried out to increase the load current CM. According to the first embodiment, however, if an arc is generated, since the switch S1 is opened to maintain the set current value Iset at the value before the arc generation, i.e., before the sputtering, it is possible to prevent an abrupt increase in the load current CM even if an arc is generated.

Figure 2:
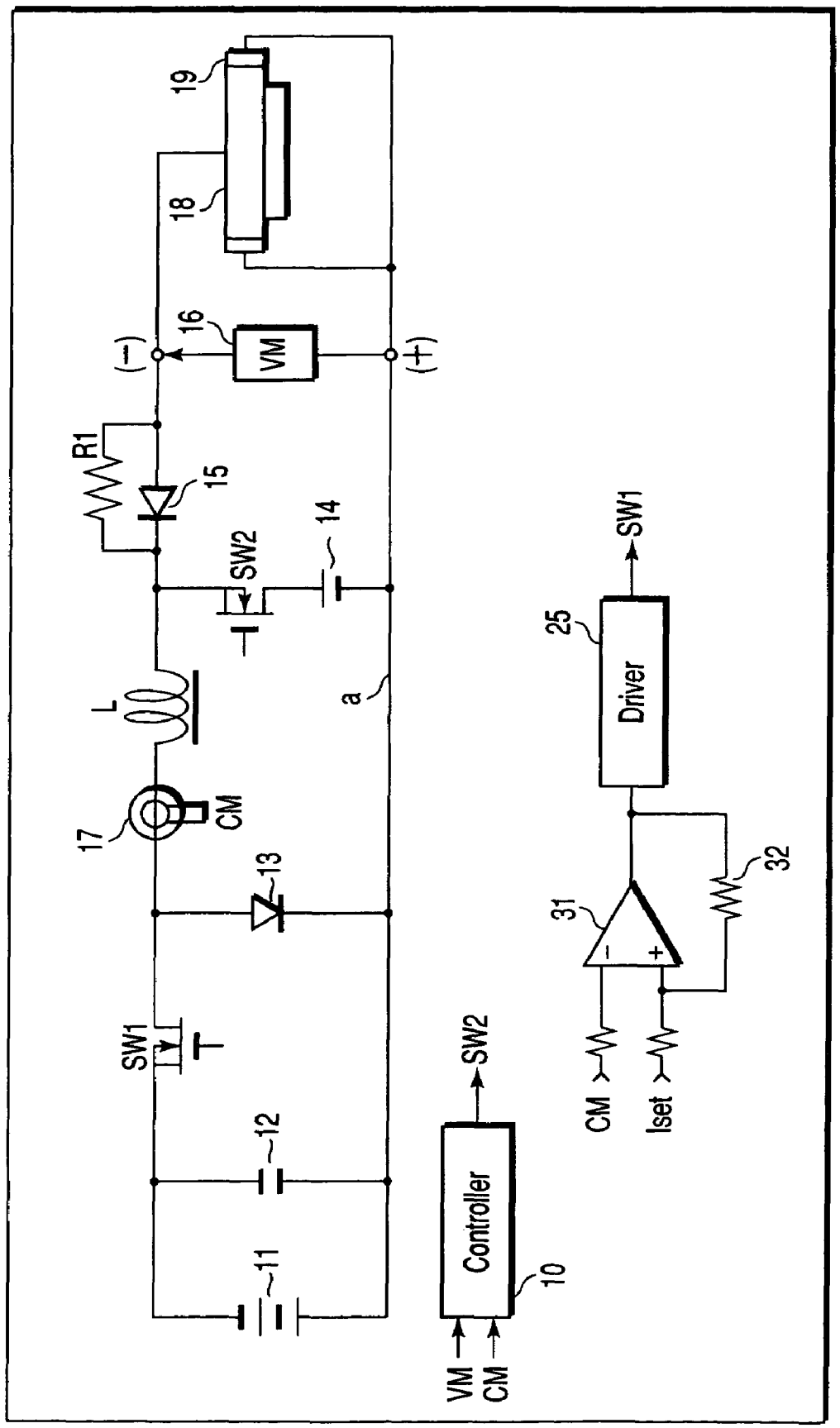
FIG. 2 is a constitutional view of a sputtering power-supply unit according to a second embodiment of the present invention.

Next, a second embodiment of the present invention will be described by referring to FIG. 2. In FIG. 2, portions similar to those of FIG. 1 are denoted by similar reference numerals, and detailed description thereof will be omitted.

The load current CM detected by the current detector 17 is input to a (−) terminal of a comparator 31. The set current value Iset is input to a (+) terminal of the comparator 31. An output of the comparator 31 is feedback through a resistor 32 to the (+) terminal of the comparator 31.

The driver 25 is connected to the output of the comparator 31. The gate control signal SW1 is output from the driver 25 to the transistor SW1.

Next, an operation of the second embodiment will be described. Since the output of the comparator 31 is feedback through the resistor 32 to the + terminal, it functions as a comparator which has hysteresis.

At a (+) input terminal of the comparator 31, a circuit constant of the resistor 32 or the like is decided to be a value higher by, e.g., 5% than that of the set current value Iset.

First, as the load current CM is zero, an input voltage of the (−) terminal of the comparator 31 is zero V. Accordingly, the output of the comparator 31 becomes +, and the gate control signal SW1 is turned ON by the driver 25 to be output to the transistor SW1. Thus, the transistor SW1 conducts, and the DC power source 11 is supplied to the chamber 19, whereby sputtering discharge is carried out.

Incidentally, when the transistor SW1 conducts, the load current CM is increased in accordance with the equation:

(voltage of DC power source 11−load voltage)=$L*di/dt$

Then, when the load current CM becomes larger than Iset*1.05, the output of the comparator 31 becomes zero V to turn OFF the gate control signal SW1 and to turn OFF the transistor SW1.

When the transistor SW1 is turned OFF, the load current CM is reduced in accordance with the equation:

(−load voltage VM)=$L*di/dt$

When the load current CM becomes lower than the set current value Iset*0.95, the output of the comparator 31 becomes + to turn ON the transistor SW1. As a result of repeating such an operation, it is possible to limit the load current CM to ±5% of the set current value Iset.

Figure 3:
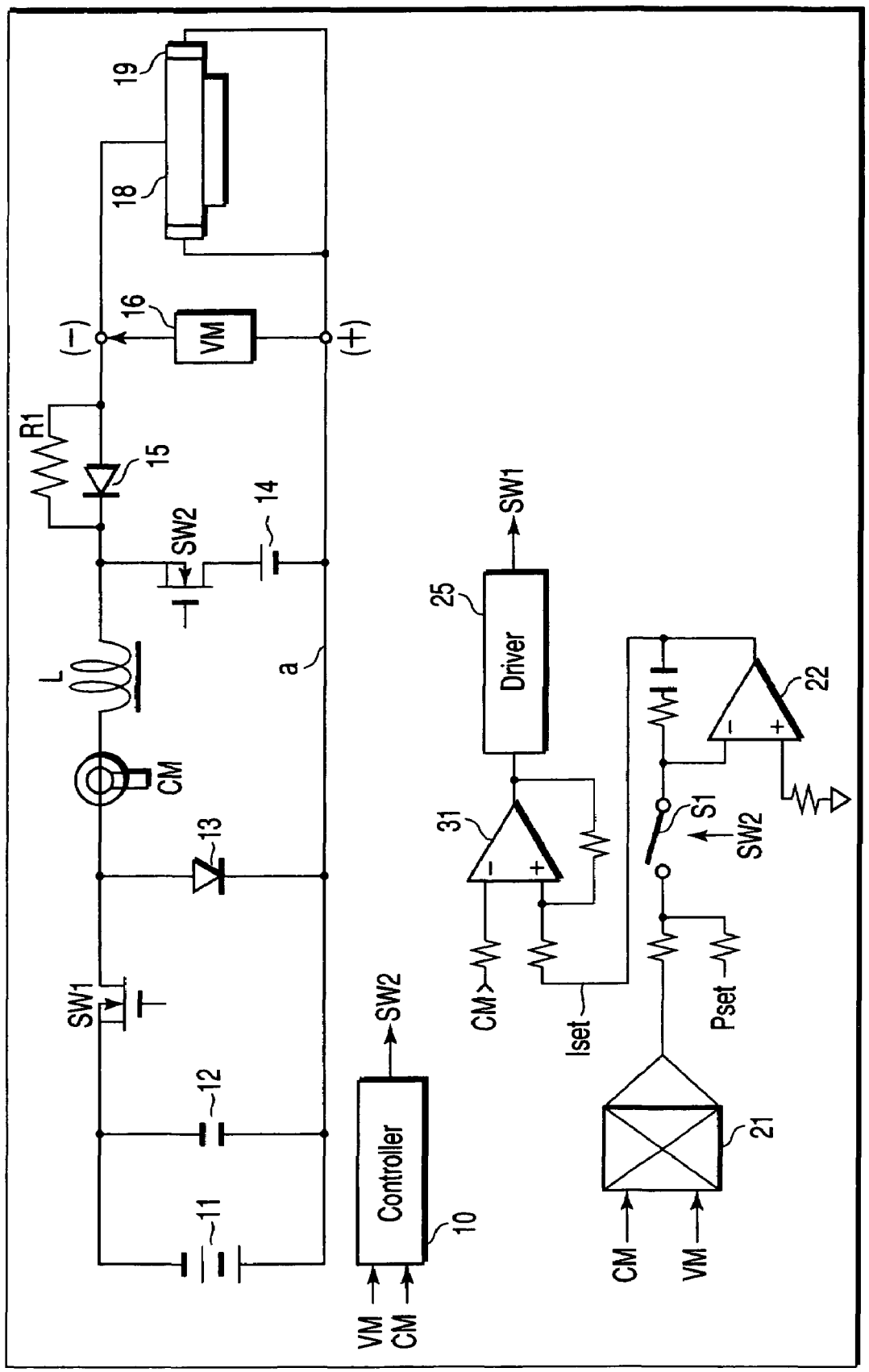
FIG. 3 is a constitutional view of a sputtering power-supply unit according to a third embodiment of the present invention.

Next, a third embodiment of the present invention will be described by referring to FIG. 3. In FIG. 3, portions similar to those of FIG. 1 and FIG. 2 are denoted by similar reference numerals, and detailed description thereof will be omitted. According to the third embodiment, as shown in FIG. 2, the transistor SW1 is driven and controlled based on the output of the comparator which has hysteresis.

As described above with reference to FIG. 1, the set current value Iset input to the (+) terminal of the comparator 31 is set based on an error between the instantaneous power and the set power Pset of the sputtering power-supply unit.

Then, by the comparator 31 which has hysteresis, the load current CM can be limited to ±5% of the set current value Iset.

Further, according to the third embodiment, the set current Iset is decided so that power supplied to the chamber 19 can be equal to the set power Pset. Moreover, when arc is generated in the chamber 19, by turning OFF the switch S1, the error amplifier 22 maintains a value immediately before the arc generation in the chamber 19. Accordingly, while the power supplied into the chamber 19 is controlled to be equal to the set power Pset, it is possible prevent an increase of the load current CM caused by arc generation in the chamber 19.

Figure 4:
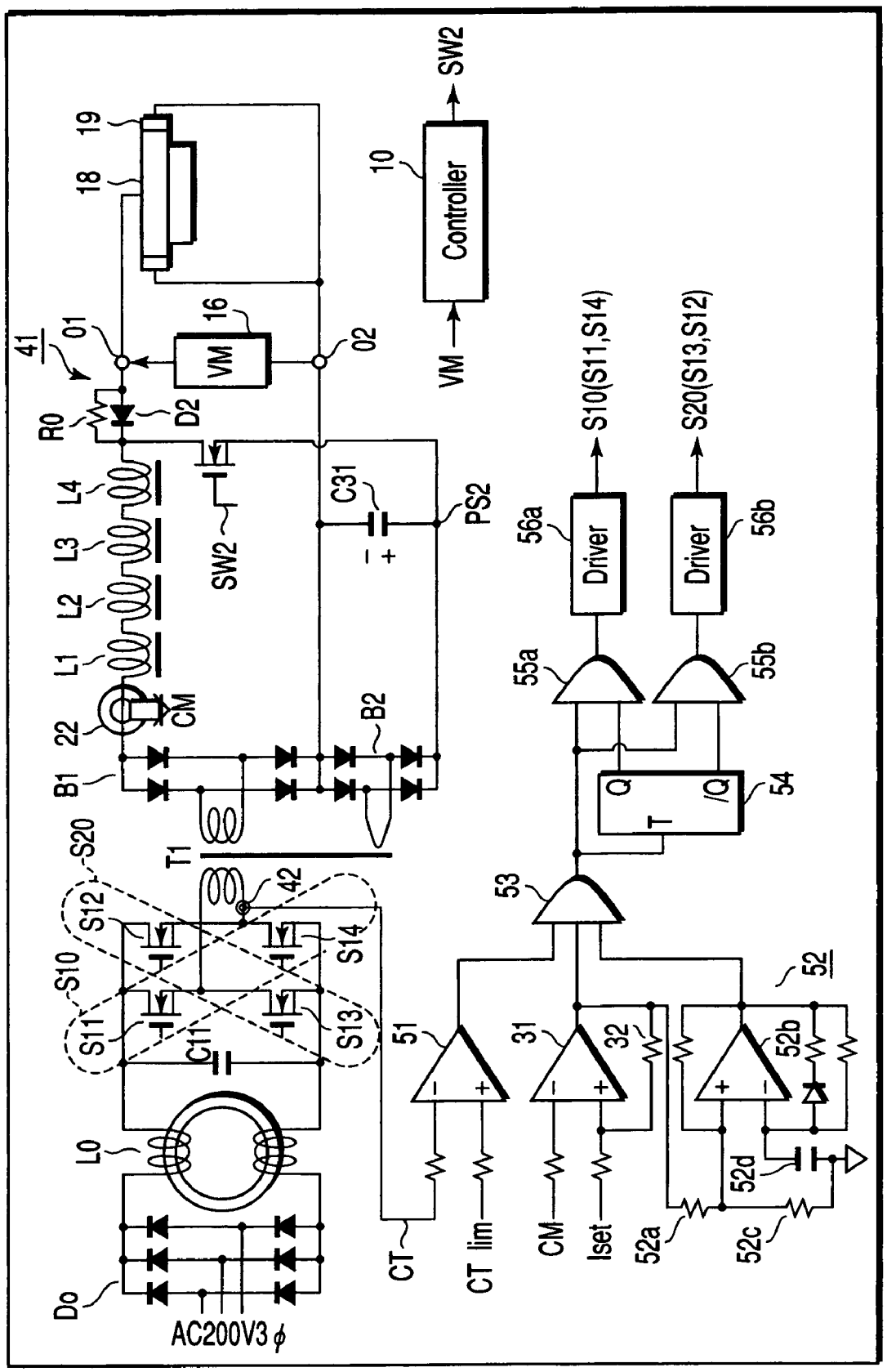
FIG. 4 is a constitutional view of a sputtering power-supply unit according to a fourth embodiment of the present invention.

Next, a fourth embodiment of the present invention will be described by referring to FIG. 4. In FIG. 4, a 3-phase AC voltage (AC 200 V3ϕ) is subjected to all-wave rectification at a 3-phase rectification circuit D0, passed through a filter L0, pulse-output by a pair of switching circuits S10, S20, and then connected to a primary side of a transformer T1.

The switching circuit S10 has switching elements S11 to S14. The switching elements S11 and S13 are serially connected, and the switching elements S12 and S14 are serially connected. Further, the two serially connected bodies are connected in parallel. ON/OFF control of these switching elements S11 to S14 is carried out based on a gate control signal from a later-described driver.

Additionally, a smoothing capacitor C11 is connected in parallel to the switching circuit S10.

A secondary side of the transformer T1 is connected to bridge circuits B1, B2 constituted of four diodes.

One end of the bridge circuit B1 connected through four serially connected independent choke coils L1 to L4, and further through a reverse-direction arc prevention circuit 41 to a (−) output terminal O1 of the unit. In this reverse-direction arc prevention circuit 41, a resistor R0 is connected in parallel to a diode D2.

Further, the other end of the bridge circuit B1 is connected to a (+) output terminal O2 of the unit. Additionally, a connection point between the choke coil L4 and the reverse-direction arc prevention circuit 41 is connected through a switching transistor (referred to as a switch SW2, hereinafter) to an anode of a reverse voltage holding capacitor C31.

The other end of the bridge circuit B1 is connected to one end of the bridge circuit B2. A connection point between the bridge circuits B1 and B2 is connected to a cathode of the capacitor C31, and to the (+) output terminal O2 of the unit.

A current flowing through the four serially connected independent choke coils L1 to L4 is detected by a current detector 22.

The (−) output terminal O1 of the unit is connected to the target 18, and the (+) output terminal O2 is connected to the chamber 19. Normally, the (+) output terminal O2 of the unit is grounded.

The controller 10 detects the load voltage VM detected by the voltage detection section 16 of the (−) output terminal O1 and the (+) output terminal O2 of the unit to determine occurrence of sputtering discharge or arc discharge in the chamber 19. Since a sputtering voltage is normally 300 V or higher, and an arc discharge voltage is 150 V or lower, when a potential difference V between the (−) output terminal O1 and the (+) output terminal O2 of the unit is reduced to 150 V or lower, the occurrence of arc discharge in the chamber 19 is determined.

Upon detection of the occurrence of arc discharge, the controller 10 turns ON the switch SW2 for set time T2 (0.3 to 10 μs) after passage of set time T1 (0.01 to 100 μs). That is, a reverse voltage pulse is applied to the target 18. During this period, the switching elements S11 to S14 are controlled to be ON/OFF by a later-described driver so that a constant current can flow through the four serially connected independent choke coils L1 to L4. That is, the load current CM flowing through the four serially connected independent choke coils L1 to L4 is detected by the current detector 22. Arc determination time T3 immediately after the application of the aforementioned reverse voltage pulse is set to 10 μs (0.01 to 10 μs) or lower. Then, if arc is determined again after passage of the arc determination time T3, a process is carried out to turn ON the switch SW2 for set time T2 (0.3 to 10 μs) after the set time T1 (0.01 to 100 μs). Thereafter, while arc is detected, the reverse voltage pulse is continuously applied until no arc is detected. Here, the switch SW2 is turned ON after the set time T1 from the arc determination because the arc may be self-quenched before the passage of the set time T1.

A current CT flowing through the primary coil of the transformer T1 is detected by a current detector 42. A reason for detecting the current flowing through the primary coil of the transformer T1 is that unless primary currents are alternately supplied within set time, magnetic saturation occurs in the transformer T1 to supply a large current, consequently destroying the switching elements S11 to S14.

The current CT flowing through the primary coil of the transformer T1, which is detected by the current detector 22, is input to a − terminal of a comparator 51, and a limiting current CT 1 im of the transformer T1 is input to a + terminal thereof.

Further, the load current CM detected by the current detector 22 is input to the − terminal of the comparator 31 which has hysteresis described above with reference to FIG. 2. The set current value Iset is input to the + terminal of the comparator 31.

Further, the output of the comparator 31 is output to a CR oscillation circuit 52. The output of the comparator 31 is input through a resistor 52a to a + terminal of a comparator 52b, and through a resistor 52c, a capacitor 52d to a − terminal of the comparator 52b. Thus, while the output of the comparator 31 is positive, the capacitor 52d is charged to increase an input potential of the − terminal thereof. At a point of time when the input potential of the − terminal of the comparator 52d becomes higher than that of the + terminal, an output of the comparator 52d becomes zero. The capacitor 52d is suddenly discharged, and becomes a + output at a point of time when it is lower than hysteresis setting of a + input.

Thus, while the output of the comparator 31 is positive, the CR oscillation circuit 52 continues oscillation.

The outputs of the comparators 51, 31 and the CR oscillation circuit 52 are input to an AND circuit 53. An output of the AND circuit 53 is input to a T input terminal of a T type FF 54, and to one input terminal of AND circuits 55a, 55b. A Q output of the T type FF 54 is input to the other input terminal of the AND circuit 55a, and its $\overline{Q}$ output is input to the other input terminal of the AND circuit 55b.

An output of the AND circuit 55a is output to a driver 56a, and an output of the AND circuit 55b is output to a driver 56b. Conduction of the switching elements S11, S14 is controlled by the driver 56a, and conduction of the switching elements S13, S12 is controlled by the driver 56b.

By the foregoing constitution, while the output of the comparator 31 is positive, the CR oscillation circuit 52 continues oscillation. Thus, for the Q output of the T type FF 54, "1" and "0" are alternately output. As a result, the drivers 56a, 56b are alternatively driven. By disposing the CR oscillation circuit as described above, it is possible to control the current flowing through the primary coil of the transformer T1 without magnetically saturating the transformer T1.

Figure 5:
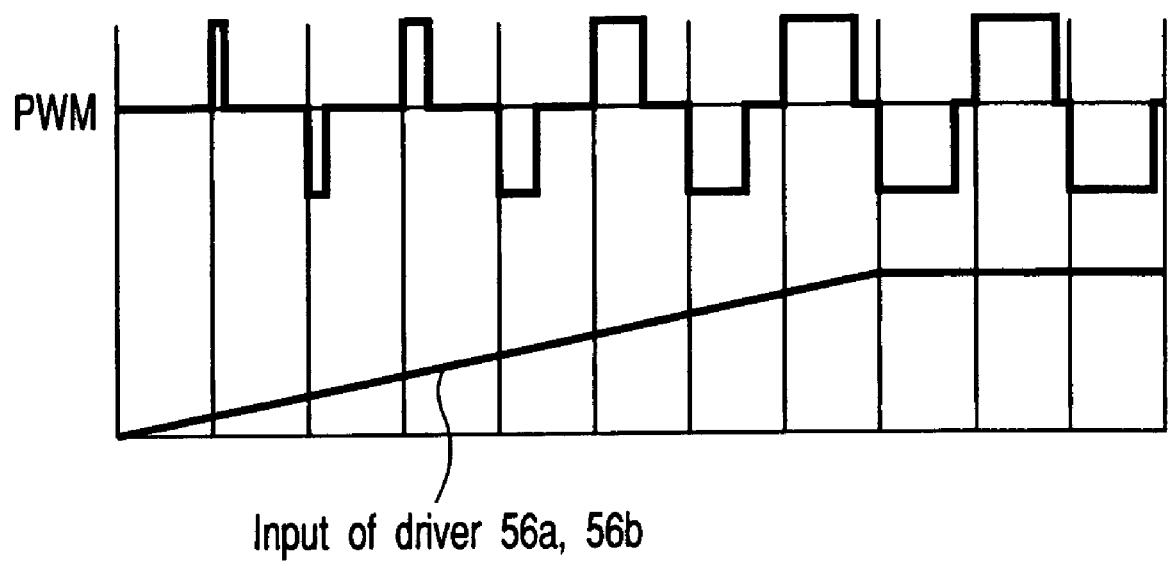
FIG. 5 is a waveform chart explaining an operation of the fourth embodiment.

In the case of controlling the current flowing through the primary coil of the transformer T1, if a first pulse width is set largest, magnetic saturation occurs by a probability of ½. Thus, in the normal drivers 56a, 56b, magnetic saturation is prevented by setting a time constant of the error amplifier to be 5 to 10 times larger than a pulse cycle to gradually increase a pulse width as shown in FIG. 5.

In the case of using the comparator 31 which has hysteresis, since a first pulse is fully open, magnetic saturation occurs by a probability of ½. Thus, when an initial current is detected by the current detector 42, and its value is determined to be larger than CT 1 im by the comparator 51, the output of the comparator 51 becomes zero. Accordingly, magnetic saturation of the transformer T1 is prevented by stopping pulses output from the drivers 56a, 56b.

Next, a fifth embodiment of the present invention will be described by referring to FIG. 6. In FIG. 6, portions similar to those of FIG. 1 and FIG. 4 are denoted by similar reference numerals, and detailed description thereof will be omitted. According to the fifth embodiment, the set current value Iset input to the + terminal of the comparator 31 which has hysteresis shown in FIG. 4 is set based on the error between the momentary power and the set power Pset of the sputtering power-supply unit as described above with reference to FIG. 1.

By the comparator 31 which has hysteresis, the load current CM can be set to ±5% of the set current value Iset.

According to the fifth embodiment, the set current Iset is decided so that power supplied to the chamber 19 can be equal to the set power Pset. Further, if arc is generated in the chamber 19, the switch S1 is turned OFF to maintain a value immediately before arc generation in chamber 19 by the error amplifier 22.

Thus, according to the fifth embodiment, in addition to the effects of the fourth embodiment, it is possible to prevent an increase of the load current CM if arc is generated in the chamber 19 while the power supplied into the chamber 19 is controlled to be equal to the set power Pset.

Next, a sixth embodiment of the present invention will be described by referring to FIG. 7. First, a basic principle of the sixth embodiment will be described. A relation between a current and a voltage flowing through the coil L is represented by the following equation:

$$E = L * di/dt \tag{1}$$

In the equation (1), if L is inductance, Vi a supply pulse, Vo an output voltage, T a PWM cycle, dt a pulse width, Is a target current, and Ir a present current, then the current di changed per cycle of the PWM is represented by the following equation:

$$di = (Vi - Vo)/L * dt - Vo/L * (T - dt) \tag{2}$$

In the equation (2), a first term means that a PWM pulse is turned ON to increase a current, and a second term means that the PWM pulse is turned OFF to supply energy stored in L to a load, thereby reducing a current.

Next, the equation (2) is developed:

$$\begin{aligned} di &= Vi/L * dt - Vo/L * dt - Vo/L * T + Vo/L * dt \\ &= Vi/L * dt - Vo/L * T \end{aligned} \tag{3}$$

In the equation (3), a first term means that a PWM pulse is turned ON to increase a current, and a second term means that Vo is output during a cycle T. Thus, a current is considered to be reduced there between.

Since the amount of control is a PWM pulse width dt, if equation (3) is solved for dt, it becomes as follows:

$$di + Vo/L * T = Vi/L * dt$$

$$\begin{aligned} dt &= (di + Vo/L * T) * L/Vi \\ &= di * L/Vi + Vo/Vi * T \end{aligned} \tag{4}$$

In the equation (4), a first term means a correction pulse width for a current excess or shortage, and a second term means a pulse width necessary for maintaining a present current by a ratio of an input voltage and an output voltage.

Further, because of di=Is−Ir, the equation (4) is changed to:

$$= (Is - Ir) * L/Vi + Vo/Vi * T$$

$$= Is * L/Vi - Ir * L/Vi + Vo/Vi * T \tag{5}$$

$$= (Is * L - Ir * L + Vo * T)/Vi \tag{6}$$

Here, in the equation (5), a first term means a pulse width for a set current, a second term means a pulse width for a present current, and a third term means a pulse width necessary for maintaining the current.

Figure 7:
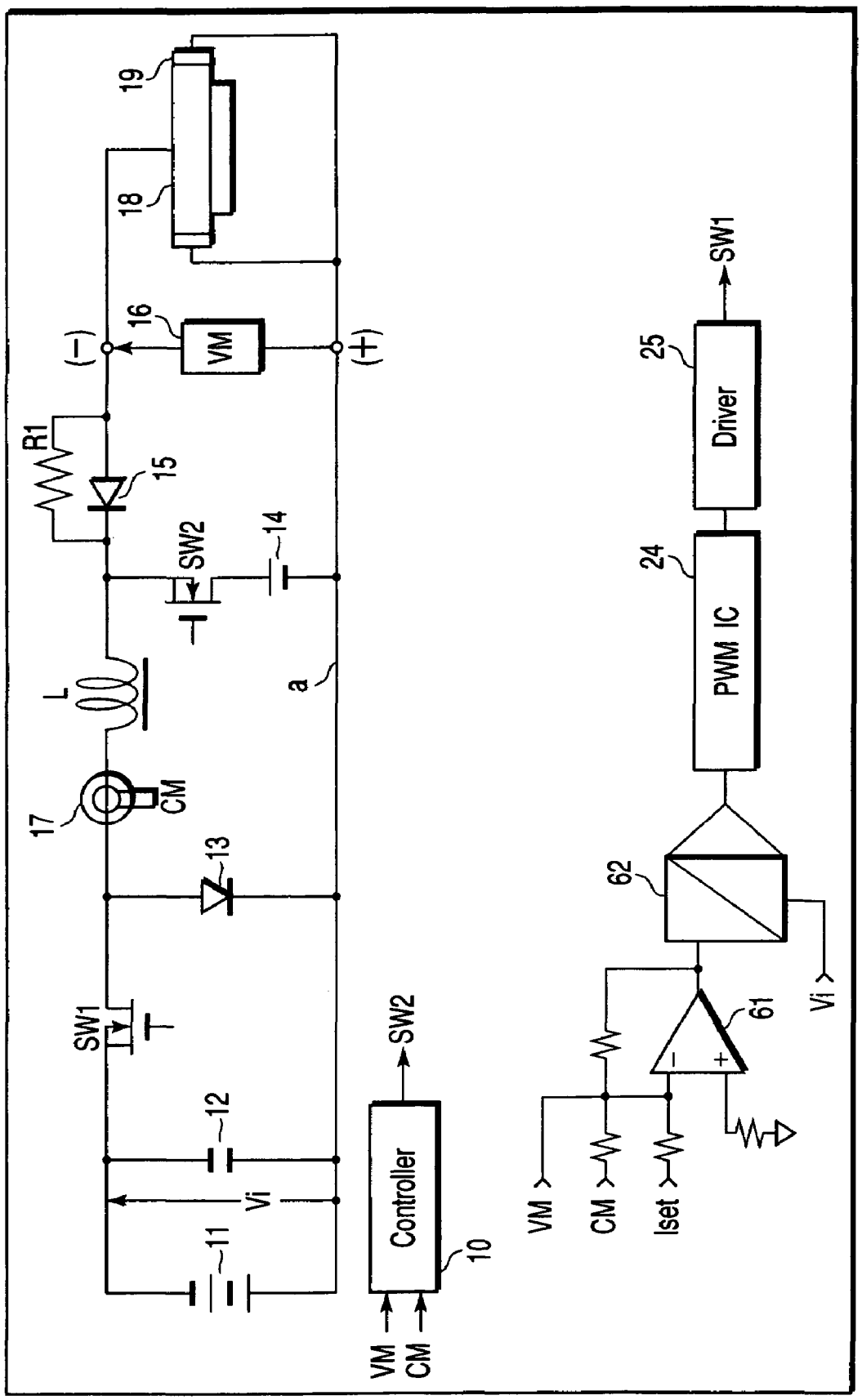
FIG. 7 is a constitutional view of a sputtering power-supply unit according to a sixth embodiment of the present invention.

A circuit on a lower side of FIG. 7 is a circuit view of the equation (6). That is, Is, Ir, Vo of the equation (6) are equivalent to a set current value Iset, a load current CM, and a load voltage VM of FIG. 7.

The load voltage VM, the load current CM, the set current value Iset are input to a – terminal of the operational amplifier 61. At this operational amplifier 61, Iset*L−CM*L+VM*T is calculated.

Then, at a divider 62, a process of dividing an output of the operational amplifier 61 by an input voltage Vi is carried out. Then, an output of the divider 62 is output to the PWMIC 24. A pulse width is decided by this PWMIC 24. Further, the driver 25 is connected to an output of the PWMIC 24, and a gate control signal SW1 is output to the transistor SW1 by this driver 25.

As described above, by carrying out an arithmetic operation based on the equation (6) at the operational amplifier 61 and the divider 62, a pulse width is decided by the PWMIC 24.

Thus, according to the sixth embodiment, since the pulse width is calculated by an average current of the cycle T as shown in the equation (6), in order to sufficiently reduce current ripples, inductance L is enlarged to enable shortening of the cycle T. That is, a PWM switching speed can be increased. Moreover, if the load voltage VM is reduced due to arc generation in the chamber 19, since a calculation result of the pulse width is obtained at a point of time when the load voltage VM is reduced, it is possible to limit an increase of the load current CM smaller.

Next, a seventh embodiment of the present invention will be described by referring to FIG. 8. In FIG. 8, portions similar to those of FIG. 7 or FIG. 1 are denoted by similar reference numerals, and detailed description will be omitted.

In FIG. 8, a set current value Iset input to a – terminal of the operational amplifier 61 is set based on an error between the instantaneous power and the set power Pset of the sputtering power-supply unit.

That is, the seventh embodiment provides the following effects in addition to those of the aforementioned sixth embodiment. That is, the set current Iset is decided so that power supplied to the chamber 19 can be equal to the set power Pset. Further, if arc is generated in the chamber 19, the switch S1 is turned OFF to hold a value immediately before the arc generation in the chamber 19 by the error amplifier 22. Thus, during control to set the power supplied into the chamber 19 equal to the set power Pset, it is possible to prevent an increase of the load current CM caused by arc generation in the chamber 19.

Figure 9:
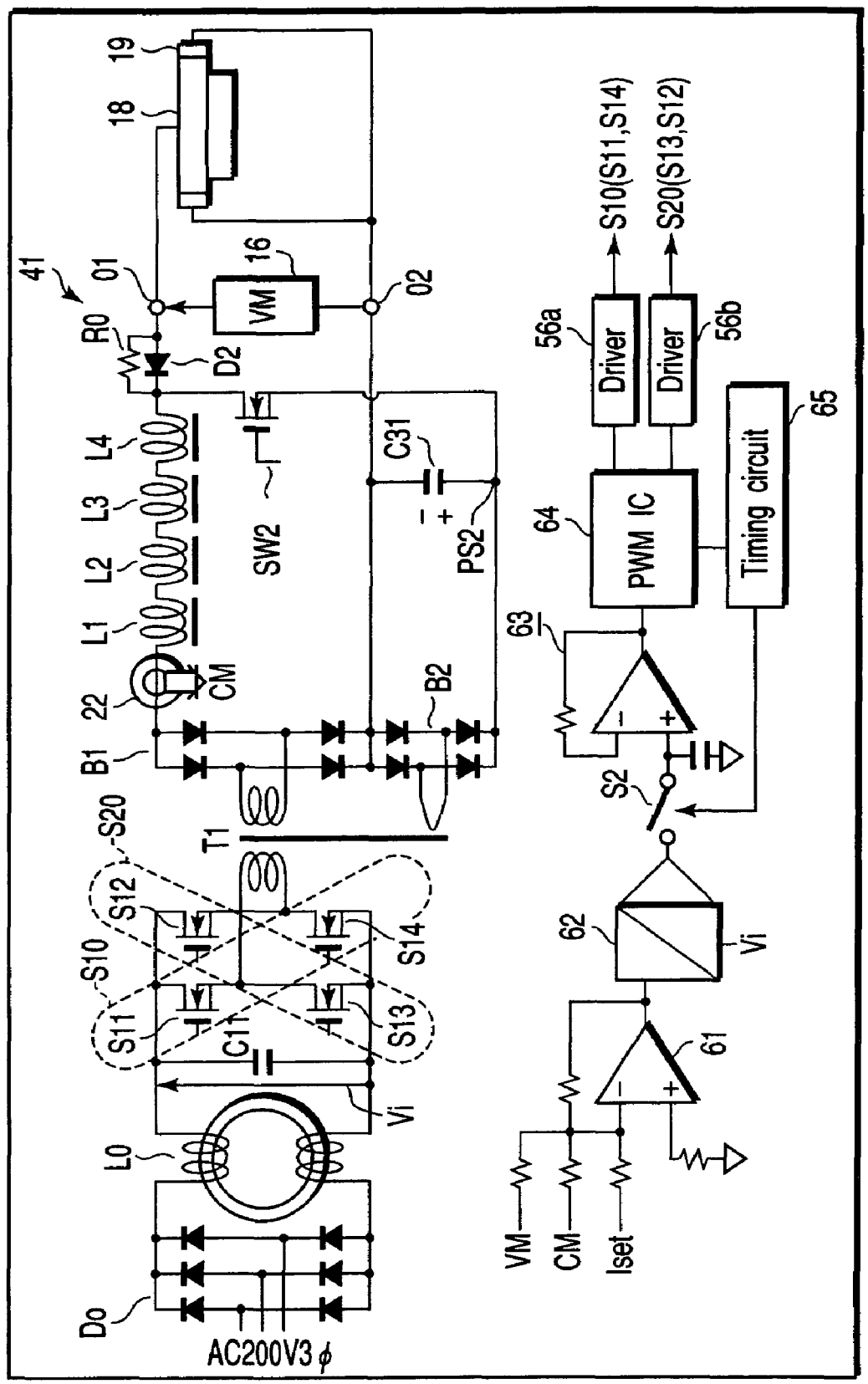
FIG. 9 is a constitutional view of a sputtering power-supply unit according to an eighth embodiment of the present invention.

Next, an eighth embodiment of the present invention will be described by referring to FIG. 9. An upper side circuit view of FIG. 9 is substantially similar to that of FIG. 6. Thus, similar portions are denoted by similar reference numerals, and detailed description thereof will be omitted.

A load voltage VM, a load current CM, and a set current value Iset are input to a – terminal of the operational amplifier 61. At this operational amplifier 61, Iset*L−CM*L+VM*T is calculated.

Then, at a divider 62, a process of dividing an output of the operational amplifier 61 by an input voltage Vi is carried out. A pulse width is decided by an output of this divider 62. The output of the divider 62 is input through the switch S2 to a sample holding circuit 63. An output of the sample holding circuit 63 is input to a PWMIC 64. Drivers 56a, 56b are connected to the PWMIC 64. Conductance of the switching elements S11, S14 is controlled by the driver 56a, and conductance of the switching elements S13, S12 is controlled by the driver 56b.

A timing circuit 65 is connected to the PWMIC 64. The timing circuit 65 controls opening/closing of the switch S2 to sample-hold the output of the divider 62 which decides the pulse width of the PWM so that positive and negative pulses output to the switching elements S11 to S14 can be set equal to prevent magnetic saturation of the transformer T1.

According to the eighth embodiment of the present invention, since the pulse width is calculated by an average current of the cycle T as shown in the equation (6), in order to sufficiently reduce current ripples, inductance L is enlarged to enable shortening of the cycle T. That is, a PWM switching speed can be increased. Moreover, if the load voltage VM is reduced due to arc generation in the chamber 19, since a calculation result of the pulse width is obtained at a point of time when the load voltage VM is reduced, it is possible to limit an increase of the load current CM smaller.

Furthermore, the timing circuit 65 controls the opening/closing of the switch S2 to sample-hold the output of the divider 62 which decides the pulse width of the PWM so that the positive and negative pulses output to the switching elements S11 to S14 can be set equal to prevent magnetic saturation of the transformer T1. Thus, it is possible to prevent magnetic saturation of the transformer T1.

Figure 10:
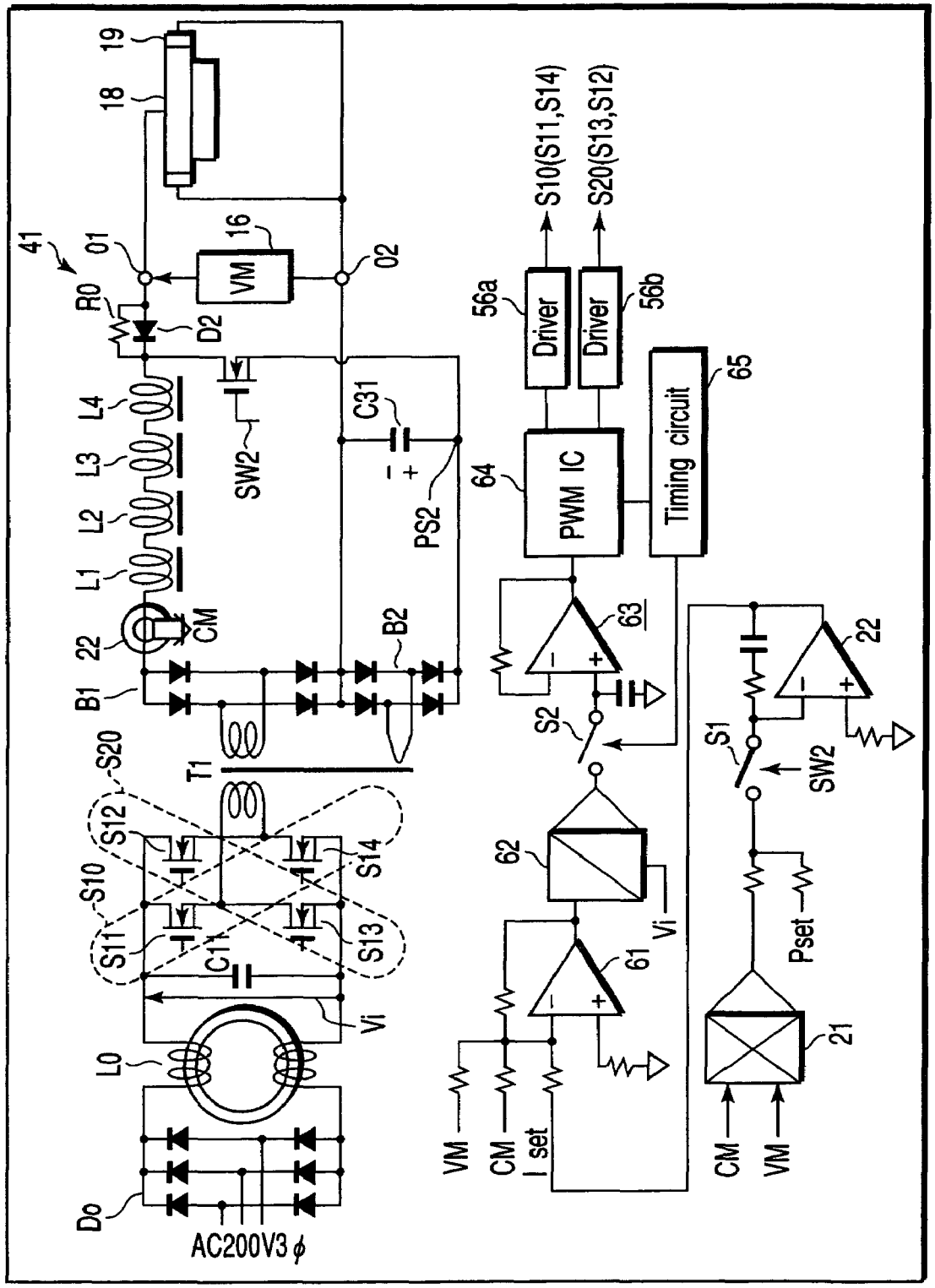
FIG. 10 is a constitutional view of a sputtering power-supply unit according to a ninth embodiment of the present invention.

Next, a ninth embodiment of the present invention will be described by referring to FIG. 10. In FIG. 10, portions similar to those of FIG. 1 or FIG. 9 are denoted by similar reference numerals, and detailed description will be omitted.

In FIG. 10, a set current value Iset input to a – terminal of the operational amplifier 61 is set based on an error between the instantaneous power and the set power Pset of the sputtering power-supply unit.

That is, the ninth embodiment provides the following effects in addition to those of the aforementioned eighth embodiment. That is, the set current Iset is decided so that power supplied to the chamber 19 can be equal to the set power Pset. Further, if arc is generated in the chamber 19, the switch S1 is turned OFF to hold a value immediately before the arc generation in the chamber 19 by the error amplifier 22. Thus, during control to set the power supplied into the chamber 19 equal to the set power Pset, it is possible to prevent an increase of the load current CM caused by arc generation in the chamber 19.

Figure 11:
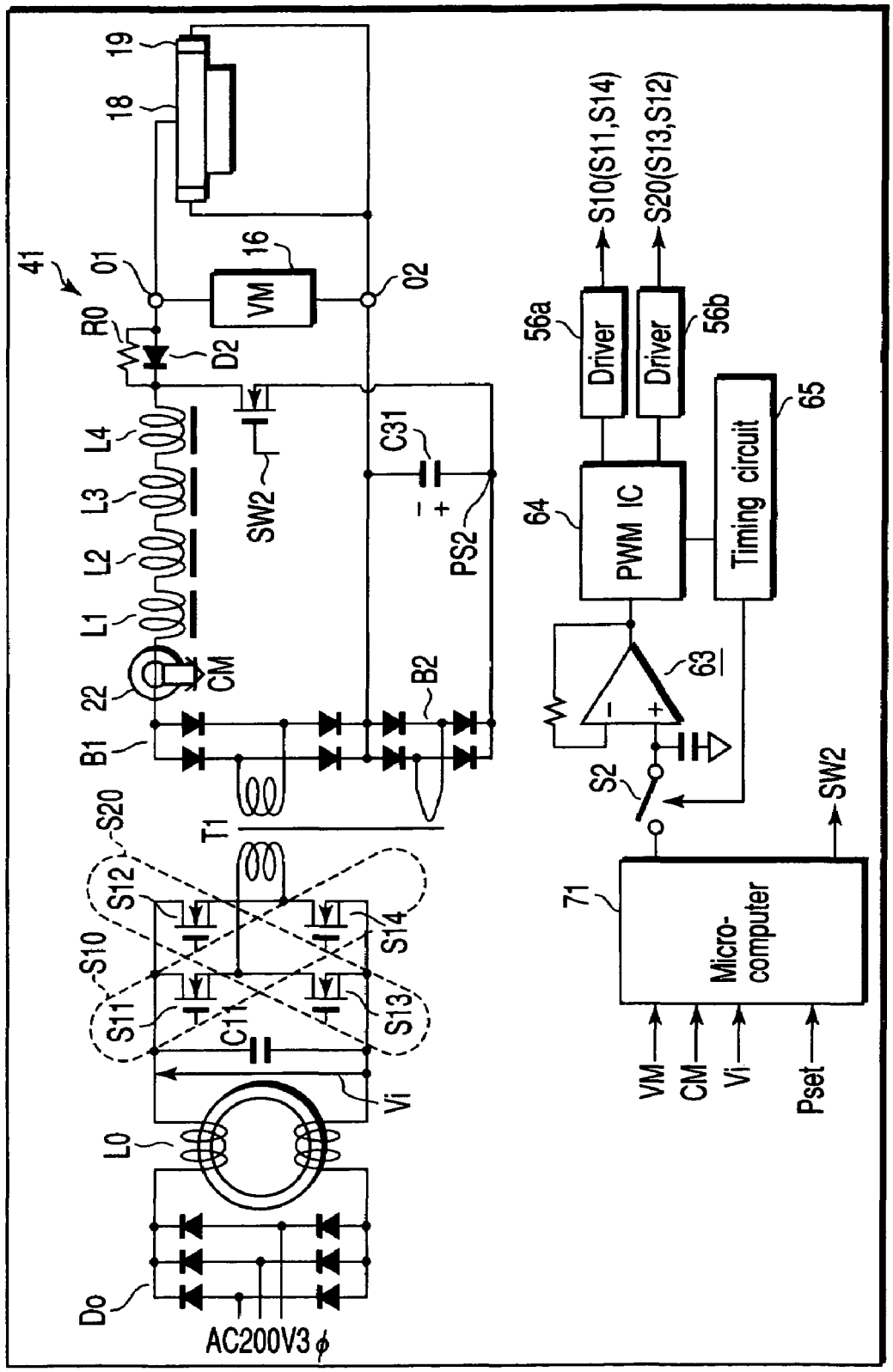
FIG. 11 is a constitutional view of a sputtering power-supply unit according to a tenth embodiment of the present invention.

Next, a tenth embodiment of the present invention will be described by referring to FIG. 11. In FIG. 11, portions similar to those of FIG. 9 are denoted by similar reference numerals, and detailed description thereof will be omitted. In FIG. 11, a microcomputer 71 is installed. In this microcomputer 71, Iset*L−CM*L+VM*T is calculated, and divided by an input voltage Vi to calculate a pulse width. Other operations are processed by the same circuit as that of FIG. 9.

Thus, the tenth embodiment has the same effects as those of the aforementioned eighth embodiment, and can digitally process the calculation of the pulse width. Moreover, the digital processing of the pulse width calculation enables learning of a value of inductance L. Thus, by learning and controlling the value of the inductance L, it is possible to carry out higher-accuracy control.

Figure 12:
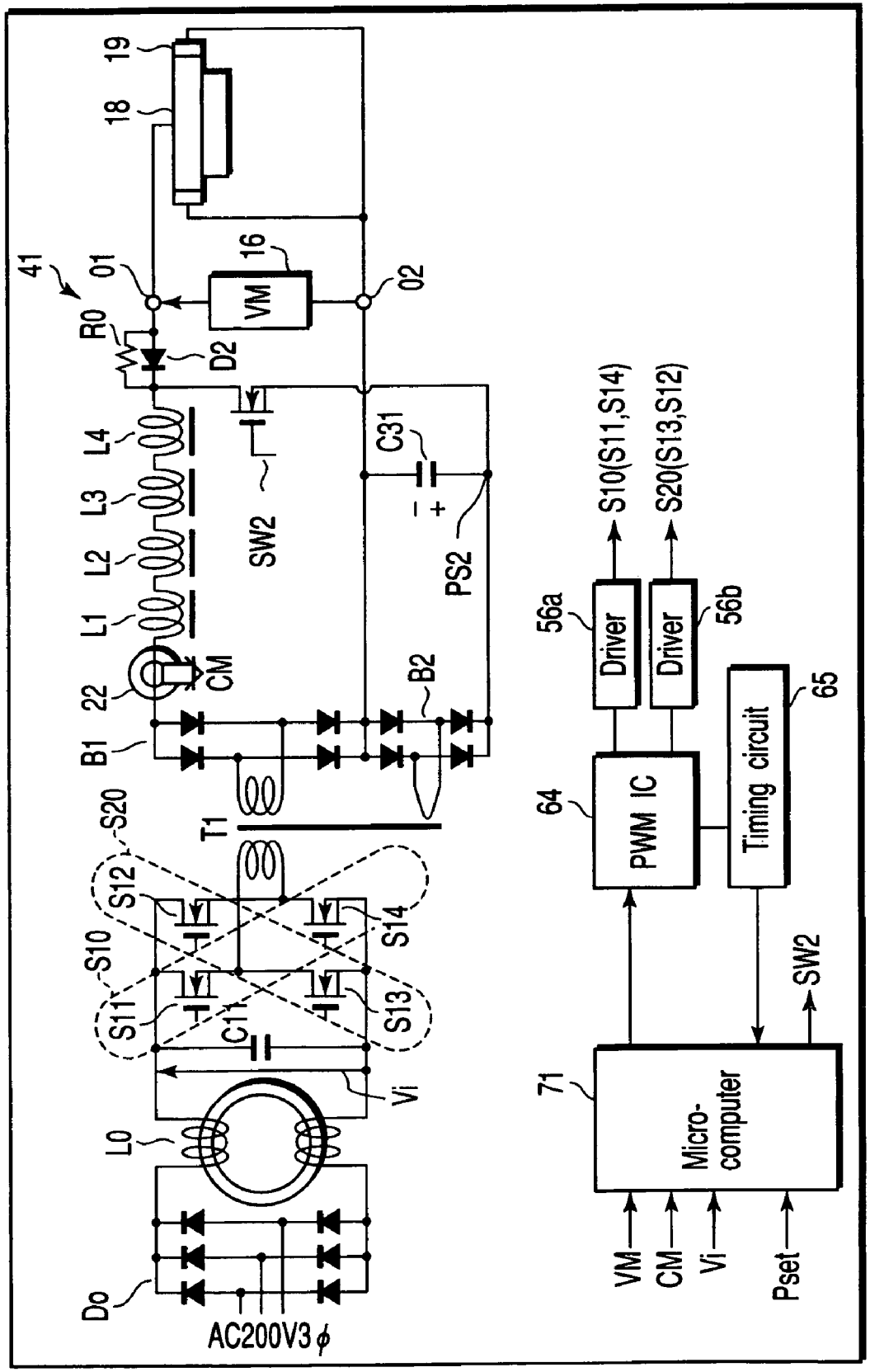
FIG. 12 is a constitutional view of a sputtering power-supply unit according to an eleventh embodiment of the present invention.

Next, an eleventh embodiment of the present invention will be described by referring to FIG. 12. In FIG. 12, the function of the sample holding circuit 63 of FIG. 11 is carried out by a microcomputer 71. Thus, an output of a timing circuit 65 is input to the microcomputer 71 to control timing for executing software processing equivalent to the sample holding circuit 63.

Thus, the eleventh embodiment has the same effects as those of the aforementioned eighth embodiment, and can digitally process calculation of a pulse width. Moreover, the digital processing of the pulse width calculation enables learning of a value of inductance L. Thus, by learning and controlling the value of the inductance L, it is possible to carry out higher-accuracy control.

Figure 13:
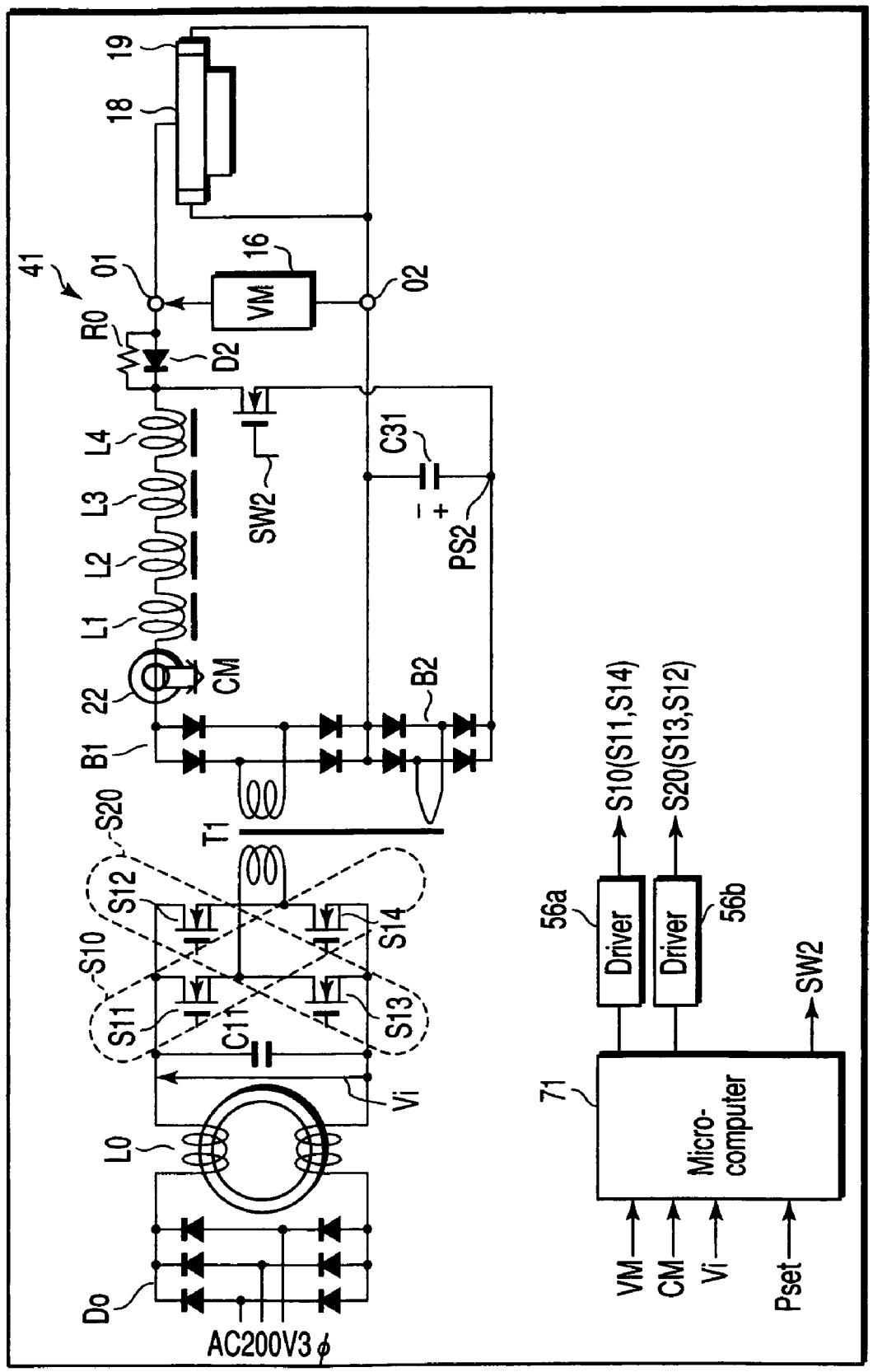
FIG. 13 is a constitutional view of a sputtering power-supply unit according to a twelfth embodiment of the present invention.

Next, a twelfth embodiment of the present invention will be described by referring to FIG. 13. A circuit of FIG. 13 carries out processing of each of the PWMIC 64 and the timing circuit 65 of FIG. 12 by the microcomputer 71.

Thus, a PWM pulse is generated by the microcomputer 71, whereby a pulse width can be decided per pulse which causes no magnetic saturation by calculation of the microcomputer 71, while in the analog circuit of FIG. 9, the magnetic saturation of the transformer T1 is prevented by the pair of pulses. Moreover, the microcomputer 71 can accurately know magnetic history of the transformer T1.

Next, a thirteenth embodiment of the present invention will be described by referring to FIG. 14. In FIG. 14, a 3-phase AC voltage (AC 200 V3φ) is subjected to all-wave rectification at a 3-phase rectification circuit D0, passed through a filter L0, pulse-output by a pair of switching circuits S10, S20, and then connected to primary sides of the transformers T11, T12.

The switching circuit S10 has switching elements S11 to S14. The switching circuit S20 has switching elements S21 to S24. ON/OFF control of these switching elements S11 to S14, S21 to S24 is carried out based on a control signal from a control section 121.

Additionally, a smoothing capacitor C11 is connected in parallel to the switching circuit S10, and a smoothing circuit C12 is connected in parallel to the switching circuit S20.

A secondary side of the transformer T11 is connected to a bridge circuit B11 constituted of four diodes, and a secondary side of the transformer T12 is connected to a bridge circuit B12 constituted of four diodes.

Further, another bridge circuit B13 is connected to the secondary side of the transformer T12.

One end of the bridge circuit B11 connected through four serially connected independent choke coils L1 to L4, and further through a reverse-direction arc prevention circuit 113 to a (−) output terminal O1 of the unit. In this reverse-direction arc prevention circuit 113, a resistor R0 is connected in parallel to a diode D2.

Further, the other end of the bridge circuit B12 is connected to a (+) output terminal O2 of the unit. Additionally, a connection point between the choke coil L4 and the reverse-direction arc prevention circuit 113 is connected through switching transistors SW21, 22 as switching means to an anode of a reverse voltage holding capacitor C31. These transistors SW21, SW22 are controlled by a driver 141. The driver 141 is controlled by a control signal from a control section 121.

In parallel with a serially connected body of the transistor SW21 and the transistor SW22, a serially connected body 51 of protective barristers (constant voltage elements) D31, D32 is connected. A current detector 142 which detects a current Ib flowing through the protective barristers D31, D32 is connected to the serially connected body 151.

The bridge circuit B12 is serially connected to the bridge circuit B11. Further, the bridge circuit B13 is serially connected to the bridge circuit B12.

A connection point between the bridge circuits B12 and B13 is connected to a cathode of the capacitor C31, and to the (+) output terminal O2 of the unit. Further, the other end of the bridge circuit B13 is connected to an anode of the capacitor C31.

A serially connected body of partial pressure resistors R1, R2 is connected between the (−) output terminal O1 and the (+) output terminal O2 of the unit. A potential V1 at a connection point between these partial pressure resistors R1 and R2 is input to the control section 121. A voltage detection section is constituted of the partial pressure resistors R1 and R2. The control section 121 is constituted of mainly, e.g., a microcomputer. The control section 121 detects the potential at the connection point between the partial pressure resistors R1 and R2 to detect a potential difference V between the (−) output terminal O1 and the (+) output terminal O2 of the unit.

The aforementioned switching elements S11 to S14, S21 to S24 and the driver 141 are controlled by the control section 121.

A current Ia flowing through the four serially connected independent choke coils L1 to L4 is detected by a current detector 122. The current Ia detected by this current detector 122 is output to the control section 121.

The (−) output terminal O1 of the unit is connected to a sputter source 131, and the (+) output terminal O2 is connected to a vacuum chamber 132. Normally, the (+) output terminal O2 of the unit is grounded.

The control section 121 detects a potential difference V between the (−) output terminal O1 and the (+) output terminal O2 of the unit to determine occurrence of sputtering discharge or arc discharge in the vacuum chamber 132. Since a sputtering voltage is normally 300 V or higher, and an arc discharge voltage is 150 V or lower, when the potential difference V between the (−) output terminal Q1 and the (+) output terminal O2 of the unit is reduced to 150 V or lower, the occurrence of arc discharge in the vacuum chamber 132 is determined.

Upon detection of the occurrence of arc discharge, the control section 121 turns ON the transistors SW21 and SW22 for set time T2 (0.3 to 10 μs) after passage of set time T1 (0.01 to 100 μs). That is, a reverse voltage pulse is applied to the sputter source 131. During this period, the switching elements S11 to S14 are controlled to be ON/OFF by the control section 121 so that a constant current can flow through the four serially connected independent choke coils L1 to L4. That is, since the current Ia flowing through the four serially connected independent choke coils L1 to L4 is detected by the current detector 122, the control section 121 controls the switching elements S11 to S14 to be ON/OFF so that the current Ia can become a constant current. Arc determination time T3 immediately after the application of the aforementioned reverse voltage pulse is set to 10 μs (0.01 to 10 μs) or lower. Then, if arc is determined again after passage of the arc determination time T3, a process is carried out to turn ON the transistors SW21 and SW22 for set time T2 (0.3 to 10 μs) after the set time T1 (0.01 to 100 μs). Thereafter, while arc is detected, the reverse voltage pulse is continuously applied until no arc is detected. Here, the transistors SW21 and SW22 are turned ON after the set time T1 from the arc determination because the arc may be self-quenched before the passage of the set time T1.

Next, an operation of the thirteen embodiment of the present invention constituted in the foregoing manner will be described. For example, a case where a cable connecting the (−) output terminal O1 to the sputter source 131 is cut will be described. In this case, the current Ia flowing through the transformers T11 and T12 is suddenly stopped. Accordingly, a voltage of the (−) output terminal O1 is increased irrespective of ON/OFF states of the transistors SW21 and 22. Then, when the voltage of the (−) output terminal O1 becomes a predetermined voltage or higher, a current flows through the protective barristers D31, D32 connected in parallel with the serially connected body of the switching transistors SW21, SW22. This current Ib is detected by a current detector 142.

When it determines in determination time that the current Ib input from the current detector 142 exceeds a reference level, the control circuit 121 outputs OFF signals to all the switching elements of the switching circuits S10 and S20.

Thus, when it is determined that the current flowing through the barristers D31, D32, which is detected by the current detector 142, exceeds the reference level, the OFF signals are output to all the switching elements of the switching circuits S10 and S20 to prevent further flowing of the current. Thus, it is possible to prevent destruction of the barristers D31, D32.

Therefore, no voltage is supplied to the primary sides of the transformers T11 and T12. Then, the control circuit 121 carries out processing to wait until the current Ib detected by the current detector 142 becomes zero.

Upon detection that the current Ib detected by the current detector 142 becomes zero, the control circuit 121 resumes selective outputting of ON signals to the switching elements which constitute the switching circuits S10 and S20. As a result, a pulse voltage is input to the primary sides of the transformers T11 and T12, and a voltage (1200 to 1500 V) for discharge starting is generated in the (−) output terminal O1.

Incidentally, if total inductance of the L1 to L4 is 10 mH, and a sputtering current is 10 A, energy EL1 is represented as follows:

$$EL1=0.01*10A*10A/2=0.5\ [J]$$

If operating voltages of the barristers D31, D32 are 1600 to 1800 V, an average 1700 V, $$1700\,V=L*di/dt$$

$dt=0.01H*10A/1700\,V=5.88e^{-5}$ are set. Energy of 60 μs and inductance L1 to L4 is absorbed by the barristers D31, D32.

Even in a case where there is no more Ar gas for sputtering discharge, and discharging cannot be carried out, by the energy stored in the inductance L1 to L4, a current flows through the barristers D31, D32 similarly to the aforementioned operation. This current Ib is detected by the current detector 142.

When it determines in determination time that the current Ib input from the current detector 142 exceeds a reference level, the control circuit 121 outputs OFF signals to all the switching elements of the switching circuits S10 and S20. Accordingly, no voltage is supplied to the primary sides of the transformer T11 and T12. Then, the control circuit 121 carries out processing to wait until the current Ib detected by the current detector 142 becomes zero.

Upon detection that the current Ib detected by the current detector 142 becomes zero, the control circuit 121 resumes selective outputting of ON signals to the switching elements which constitute the switching circuits S10 and S20.

Thus, even if a cable connecting (−) output terminal O1 to the sputter source 131 is cut, a voltage applied to the transistors SW21 and SW22 is absorbed by the barristers D31, D32 and, by detecting a current flowing through the barristers D31, D32, it is possible to prevent destruction of the barristers D31, D32.

Figure 15:
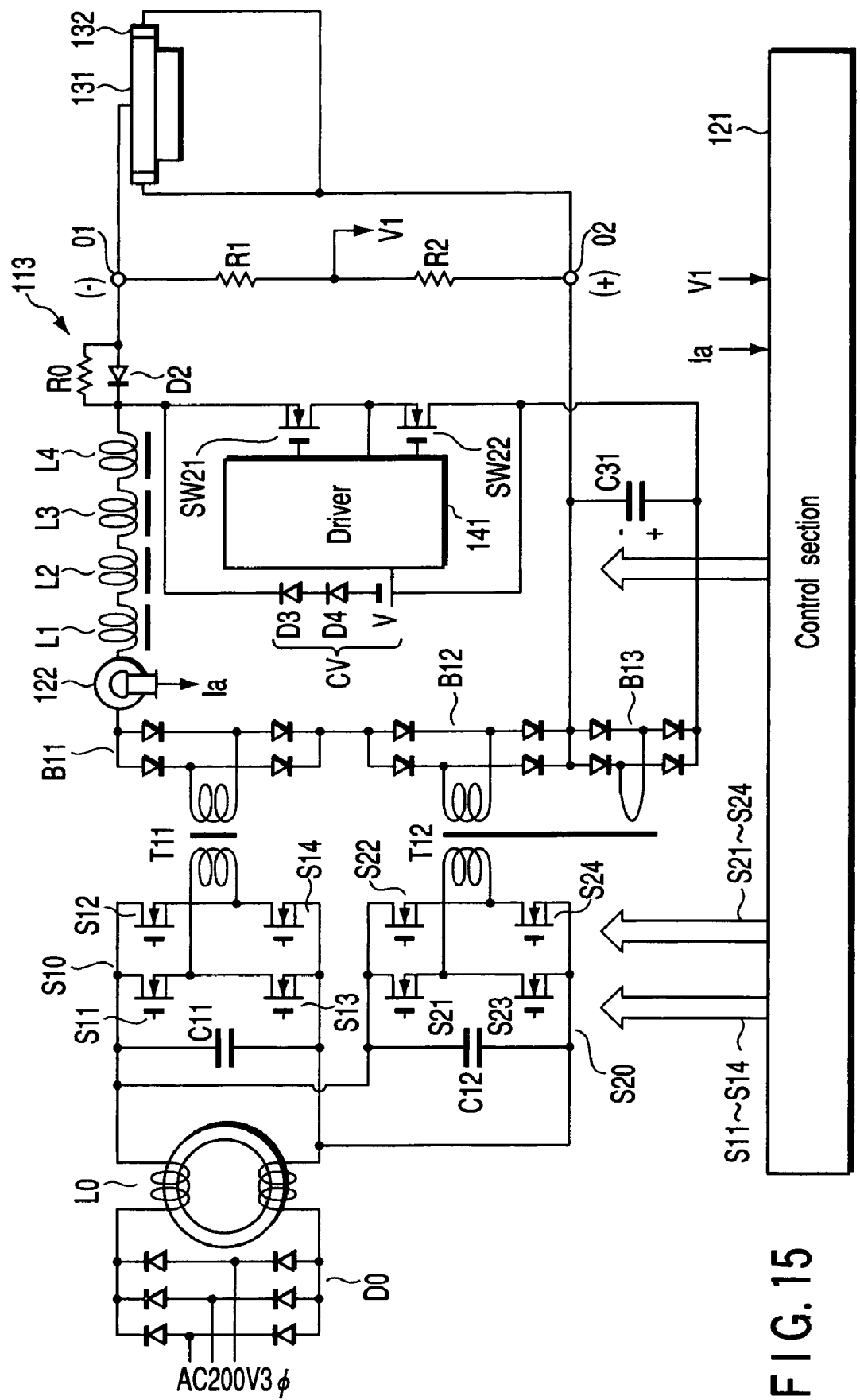
FIG. 15 is a constitutional view of a sputtering power-supply unit according to a fourteenth embodiment of the present invention.

Next, a fourteenth embodiment of the present invention will be described by referring to FIG. 15. In FIG. 15, portions similar to those of FIG. 14 are denoted by similar reference numerals, and detailed description thereof will be omitted.

According to the fourteenth embodiment, in place of the serially connected body 151 where the barristers D32, D32 and the current detector 142 are arranged, a constant voltage power source CV constituted of diodes D3, D4 may be disposed.

An operation of the fourteenth embodiment is similar to that of the thirteenth embodiment, and this description will be omitted.

According to the present invention, it is possible to provide a sputtering power-supply unit which can reduce fluctuation in a sputtering current even if arc discharge occurs.

What is claimed is:

1. A sputtering power supply unit comprising:
   a sputtering DC power source for supplying DC power to a sputtering apparatus;
   a switching unit connected across terminals of the sputtering DC power source;
   at least one choke coil serially connected between the switching unit and the sputtering apparatus;
   a current detection unit for detecting a current supplied to the sputtering apparatus from the sputtering DC power source via the choke coil;
   a voltage detection unit for detecting a voltage across power source terminals of the sputtering apparatus;
   a controller outputting a switching signal when a voltage corresponding to an arc discharge generated inside the sputtering apparatus is detected by the voltage detection unit;
   a first switch which is closed by the switching signal;
   a reverse voltage source for supplying via the first switch a reverse voltage across the power source terminals of the sputtering apparatus for stopping the arc discharge;
   means for calculating an instantaneous power supplied to the sputtering apparatus from the voltage detected by the voltage detection unit and the current detected by the current detection unit;
   integration means for generating an integration output obtained by integrating a difference value between the instantaneous power obtained in the calculating means and a predetermined set power;
   means for generating a pulse output having a pulse width corresponding to a difference between a current set value formed on the basis of the integration output and the current detected by the current detection unit;
   means for on/off controlling the switching unit according to the pulse output from the generating means;
   means for stopping the instantaneous power from being supplied to the integration means when the first switch is closed in response to the arc discharge; and
   means for controlling the current supplied to the sputtering apparatus by on/off controlling the switching unit using the pulse output generated from the pulse outputting means in accordance with an integration output held in the integration means when the supply of the instantaneous power to the integration means is stopped by the stopping means.

2. A sputtering power supply unit according to claim 1, further comprising a reverse-direction arc prevention circuit connected between one end of the first switch and one of the power source terminals of the sputtering apparatus.

3. A sputtering power supply unit according to claim 1, wherein the pulse output generating means comprises a comparator having a hysteresis characteristic and configured to compare the current set value formed on the basis of the integration output obtained in the integration means and the current detected in the current detection unit, and means for on/off controlling the switching unit in response to a comparison output of the comparator.

4. A sputtering power supply unit according to claim 1, wherein the pulse output generating means comprises an operational amplifier for performing a calculation, $$\text{Iset}*L = CM*L + VM*T$$

wherein Iset denotes the set current value based on the integration output obtained from the integration means, CM denotes the current value detected at the current detection unit, VIM denotes the voltage value detected at the voltage detection unit, and L denotes an inductance of the choke coil;

a division circuit which divides an output value of the operational amplifier by an output voltage of the sputtering DC power source; and a driving circuit for outputting the pulse output in accordance with a division output of the division circuit.

5. A sputtering power supply unit according to claim 1, wherein the sputtering DC power source comprises a first rectifier circuit for rectifying an alternating power source voltage to a DC voltage, a switching circuit for converting the DC voltage from the first rectifier circuit to a pulse voltage, and a pulse transformer having a primary coil supplied with the pulse voltage and a secondary coil connected with a second rectifier circuit;

the switching unit comprises a plurality of switching elements for supplying the DC voltage rectified by the first rectifier circuit to the primary coil of the pulse transformer as an alternately reversing pulse voltage at a predetermined interval of time as the pulse voltage;

the at least one choke coil is serially connected between one output terminal of the second rectifier circuit provided at the secondary coil of the pulse transformer and one of the power source terminals of the sputtering apparatus; and the reverse voltage source comprises an auxiliary rectifier circuit rectifying an alternating voltage generated at the secondary of the pulse transformer, and a capacitor connected to be charged with a DC voltage supplied from the auxiliary rectifier circuit.

6. A sputtering power supply unit according to claim 5, wherein the pulse output generating means comprises a sample/hold circuit for sampling/holding a division output from the division circuit, a pulse generation circuit for generating the pulse signal having a pulse width corresponding to an output of the sample/hold circuit being supplied to the switching circuit, and a timing circuit for determining a sampling period for the sample/hold circuit.

7. A sputtering power supply unit according to claim 5, which further comprises a primary current detection circuit for detecting a current flowing in the primary coil of the pulse transformer, and means for stopping the pulse output from the pulse output generating means when a value of the current is larger than a limit value for preventing magnetic saturation at the pulse transformer.

8. A sputtering power supply unit according to claim 7, which further comprises a CR oscillation circuit supplied with an output from the comparator having the hysteresis characteristic, wherein the switching signal is supplied to the switching unit in accordance with an oscillation output from the CR oscillation circuit.

9. A sputtering power supply unit according to claim 4, wherein at least the operational amplifier and the division circuit are composed of a microcomputer.

10. A sputtering power supply unit according to claim 6, wherein the division circuit and the sample/hold circuit are composed of a microcomputer.

* * * * *